United States Patent
Breitwisch et al.

(10) Patent No.: US 7,479,671 B2
(45) Date of Patent: Jan. 20, 2009

(54) THIN FILM PHASE CHANGE MEMORY CELL FORMED ON SILICON-ON-INSULATOR SUBSTRATE

(75) Inventors: Matthew J. Breitwisch, Yorktown Heights, NY (US); Chung Hon Lam, Peekskill, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/511,680

(22) Filed: Aug. 29, 2006

(65) Prior Publication Data

US 2008/0054323 A1 Mar. 6, 2008

(51) Int. Cl.
- H01L 27/148 (2006.01)
- H01L 29/768 (2006.01)
- H01L 27/10 (2006.01)
- H01L 29/73 (2006.01)
- H01L 29/74 (2006.01)
- H01L 29/00 (2006.01)
- H01L 23/48 (2006.01)
- H01L 23/52 (2006.01)
- H01L 29/40 (2006.01)

(52) U.S. Cl. .......... 257/246; 257/207; 257/208; 257/211; 257/244; 257/247; 257/248; 257/249; 257/521; 257/527; 257/559; 257/758; 257/759; 257/760; 257/774

(58) Field of Classification Search ......... 257/207–208, 257/211, 521, 527, 758–760, 244, 246–249, 257/559, 774
See application file for complete search history.

(56) References Cited

U.S. PATENT DOCUMENTS

| | | | |
|---|---|---|---|
| 5,395,777 A * | 3/1995 | Yang | 438/274 |
| 6,365,256 B1 * | 4/2002 | Tyan et al. | 428/64.1 |
| 2004/0113181 A1 * | 6/2004 | Wicker | 257/246 |
| 2004/0203183 A1 * | 10/2004 | Cho et al. | 438/102 |
| 2005/0227177 A1 * | 10/2005 | Sun et al. | 430/270.13 |
| 2006/0186440 A1 * | 8/2006 | Wang et al. | 257/246 |
| 2007/0160760 A1 * | 7/2007 | Shin et al. | 427/255.35 |
| 2007/0221905 A1 * | 9/2007 | Liu | 257/2 |
| 2007/0246766 A1 * | 10/2007 | Liu | 257/314 |
| 2007/0249090 A1 * | 10/2007 | Philipp et al. | 438/102 |

(Continued)

OTHER PUBLICATIONS

A. Pirovano et al., "Electronic Switching in Phase-Change Memories," IEEE Transactions on Electron Devices, vol. 51, No. 3, pp. 452-459, Mar. 2004.

(Continued)

Primary Examiner—Ida M Soward
(74) Attorney, Agent, or Firm—Ido Tuchman; Ryan, Mason & Lewis, LLP (57) ABSTRACT

A memory cell includes a semiconductor feature and a phase change material. The semiconductor feature defines a groove that divides the semiconductor feature into a first electrode and a second electrode. The phase change material at least partially fills this groove and acts to electrically couple the first and second electrodes. At least a portion of the phase change material is operative to switch between lower and higher electrical resistance states in response to an application of a switching signal to at least one of the first and second electrodes. The semiconductor feature comprises silicon and the groove comprises at least one silicon sidewall with a substantially <111> crystal plane orientation.

19 Claims, 9 Drawing Sheets

U.S. PATENT DOCUMENTS

2007/0284635 A1* 12/2007 Fournier .................... 257/295
2008/0017894 A1* 1/2008 Happ et al. ................ 257/246

OTHER PUBLICATIONS

J. Knoch et al., "Technology for the Fabrication of Ultrashort Channel Metal-Oxide-Semiconductor Field-Effect Transistors," Journal of Vacuum Science and Technology A, vol. 19, No. 4, pp. 1737-1741, Jul./Aug. 2001.

H. Seidel et al., "Anisotropic Etching of Crystalline Silicon in Alkaline Solutions," J. Electrochem. Soc., vol. 137, No. 11, pp. 3612-3626, Nov. 1990.

* cited by examiner

THIN FILM PHASE CHANGE MEMORY CELL FORMED ON SILICON-ON-INSULATOR SUBSTRATE

FIELD OF THE INVENTION

This invention relates generally to memory cells in integrated circuits, and, more particularly, to memory cells comprising phase change materials.

BACKGROUND OF THE INVENTION

The possibility of using phase change materials (PCMs) in nonvolatile memory cells has recently gained momentum as more is learned about these materials and their integration into integrated circuits. When incorporated into a memory cell, these materials may be toggled between higher and lower electrical resistance states by applying a pulse of electrical current ("switching current pulse") to the memory cell. Subsequently, after writing to a memory cell in this way, the electrical resistance state of the given memory cell may be determined (i.e., read) by applying a low magnitude sensing voltage to the material in order to determine its electrical resistance state. Notably, in some designs, a PCM-based memory cell may even be able to simultaneously store more than one bit of information.

Currently, binary and ternary chalcogenide alloys such as doped SbTe and $Ge_2Sb_2Te_5$ (GST) are showing the greatest promise for use in practical PCM-based memory cells. A. Pirovano et al., "Electronic Switching in Phase-Change Memories," IEEE Transactions on Electron Devices, Vol. 51, No. 3, March 2004, for example, describes such a use of chalcogenides and is incorporated herein by reference. However, the switching of a PCM-based memory cell requires that the switching current pulse produce enough heat in the PCM to cause at least some portion of the PCM to reproducibly change electrical resistance state. The required temperature, for example, may be as high as 650 degrees Celsius. If the memory cell is not properly designed, the magnitude of the switching current pulse necessary to create these required temperatures may easily exceed that which can be tolerated by modern integrated circuits.

For this reason, a thin film memory cell is an attractive solution for PCM-based memory cells. In such a memory cell, the switching current is forced along a thin film of PCM. As a result, the magnitude of the switching current may be tuned by adjusting the thickness of the PCM layer as well as its width and the length through which the switching current must pass. Nevertheless, despite the apparent advantages of such a design, precise control of these dimensional parameters remains challenging from a processing standpoint. Accordingly, there remains a need for an easily manufactured thin film PCM-based memory cell that allows precise tuning of the switching current pulse magnitude.

SUMMARY OF THE INVENTION

Embodiments of the present invention address the above-identified need by providing PCM-based memory cells that allow the precise tuning of the switching current pulse. Advantageously, these designs provide high localized switching current density and heating efficiency so that the magnitude of the switching current pulse may be reduced to a value that is compatible with modern integrated circuits.

In accordance with an aspect of the invention, a memory cell comprises a semiconductor feature and a PCM. The semiconductor feature defines a groove that divides the semiconductor feature into a first electrode and a second electrode. The PCM at least partially fills this groove and acts to electrically couple the first and second electrodes. At least a portion of the PCM is operative to switch between lower and higher electrical resistance states in response to an application of a switching signal to at least one of the first and second electrodes. The semiconductor feature comprises silicon and the groove comprises at least one silicon sidewall with a substantially <111> crystal plane orientation.

In accordance with another aspect of the invention, a method of forming a memory cell comprises the steps of forming a semiconductor feature and forming phase change material. The semiconductor feature defines a groove that divides the semiconductor feature into a first electrode and a second electrode. The phase change material at least partially fills the groove and electrically couples the first and second electrodes. At least a portion of the phase change material is operative to switch between lower and higher electrical resistance states in response to an application of a switching signal to at least one of the first and second electrodes. The semiconductor feature comprises silicon and the groove comprises at least one silicon sidewall with a substantially <111> crystal plane orientation.

In accordance with a further aspect of the invention, an integrated circuit comprises one or more memory cells. At least one of the one or more memory cells comprises a semiconductor feature and a PCM. The semiconductor feature defines a groove that divides the semiconductor feature into a first electrode and a second electrode. The PCM at least partially fills this groove and acts to electrically couple the first and second electrodes. At least a portion of the PCM is operative to switch between lower and higher electrical resistance states in response to an application of a switching signal to at least one of the first and second electrodes. The semiconductor feature comprises silicon and the groove comprises at least one silicon sidewall with a substantially <111> crystal plane orientation.

These and other features and advantages of the present invention will become apparent from the following detailed description which is to be read in conjunction with the accompanying drawings.

DETAILED DESCRIPTION OF THE INVENTION

This invention will be illustrated herein in conjunction with exemplary memory cells for use in integrated circuits, and methods for forming such memory cells. It should be understood, however, that the invention is not limited to the particular materials, features and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions. Moreover, details of the processing steps used to fabricate such integrated circuit devices may be found in a number of publications, for example, S. Wolf and R. N. Tauber, *Silicon Processing for the VLSI Era, Volume* 1, Lattice Press, 1986 and S. M. Sze, *VLSI Technology, Second Edition*, McGraw-Hill, 1988.

The term "phase-change material" (PCM) as used herein is intended to encompass any material displaying more than one programmable electrical resistance state for use in integrated circuits. It is recognized that this definition may encompass more materials than are customarily included within this term. PCMs as used herein comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $In_2Se_3$, $Ca_2Nb_2O_7$, $(Pr,Ca)MnO_3$, $Ta_2O_5$, $NiO_x$ and $TiO_x$, as well as other suitable materials.

Two illustrative memory cell embodiments will be described herein with reference to the accompanying figures. The design and operating characteristics of the first memory cell embodiment will be described and then illustrative methods for forming that memory cell in an integrated circuit will be addressed. Subsequently, aspects of the second memory cell embodiment will be described in the same order.

Figure 1A:
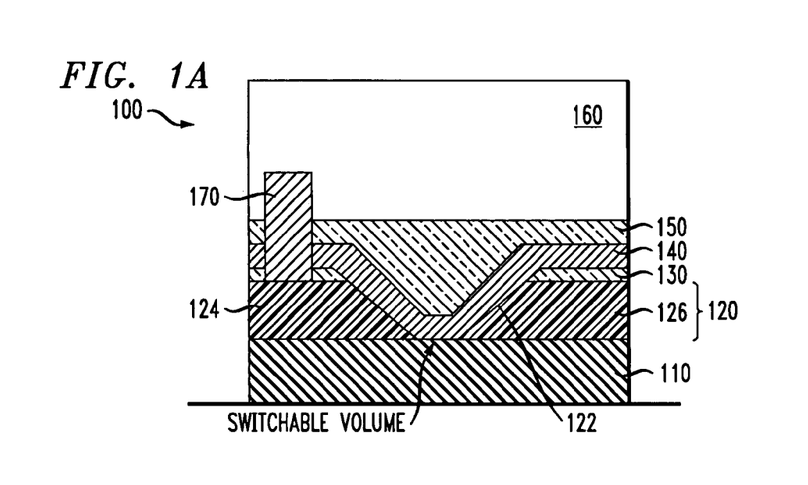
FIG. 1A shows a sectional view of a memory cell in accordance with an illustrative embodiment of the invention.
Figure 1B:
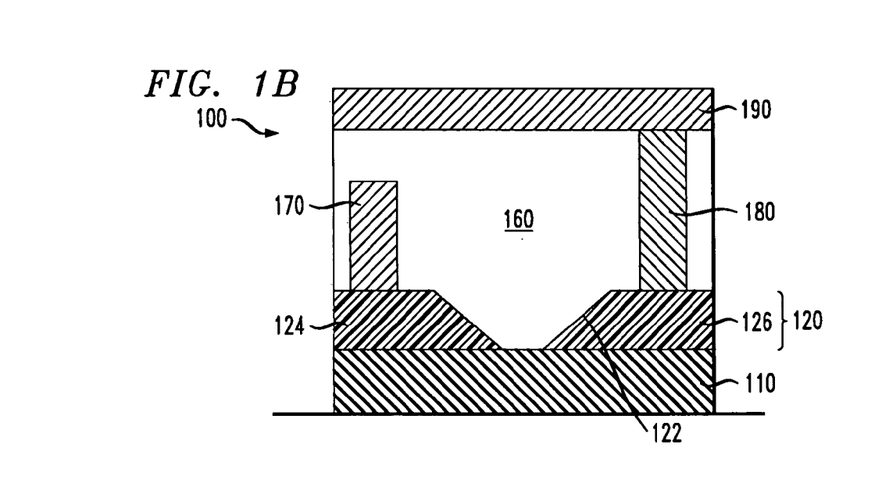
FIG. 1B shows another sectional view of the FIG. 1A memory cell.
Figure 1C:
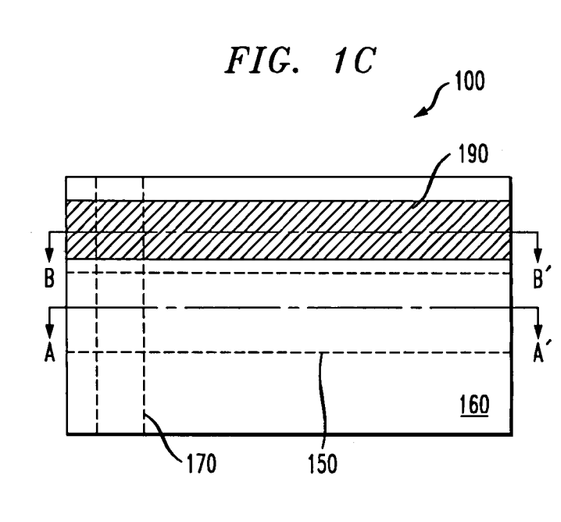
FIG. 1C shows a plan view of the FIG. 1A memory cell.

FIGS. 1A and 1B show sectional views of a memory cell 100 in accordance with an illustrative embodiment of the invention. FIG. 1C shows a plan view of the same memory cell. The sectional view in FIG. 1A is cut in the plane defined by the line A-A' shown in FIG. 1C. The sectional view in FIG. 1B is cut in the plane defined by the line B-B' shown in FIG. 1C.

The memory cell 100 comprises an insulating layer 110, a silicon layer 120 and a dielectric layer 130. The silicon layer defines a groove 122 that separates the silicon layer into a left silicon electrode 124 and right silicon electrode 126. The groove is partially filled by a PCM layer 140. The memory cell further comprises a dielectric hard mask layer 150 and an interlevel dielectric (ILD) layer 160. A lower metal line 170 is in physical contact with the left silicon electrode. A vertical contact 180 connects the right silicon electrode to an upper metal line 190.

The different views provided by FIGS. 1A-1C show that the dielectric layer 130, the PCM layer 140 and the dielectric hard mask layer 150 form a stripe that runs through the middle of the memory cell 100. Outside of this stripe, these elements are not present and the ILD layer 160 directly contacts the silicon feature 120 and the insulating layer 110.

In the illustrative memory cell 100, the insulating layer 110 and dielectric layer 130 preferably comprise silicon dioxide while the silicon feature 120 preferably comprises highly n-doped crystalline silicon (giving the silicon feature a relatively low electrical resistivity). The PCM layer 140, in turn, preferably comprises GST, and the dielectric hard mask layer 150 preferably comprises silicon dioxide or silicon nitride. The ILD layer 160 preferably comprises silicon dioxide. The lower metal line 170 and upper metal line 190 run substantially perpendicular to one another. These lines and vertical contact 180 preferably comprises copper, but may, alternatively, comprise other suitable materials such as aluminum or tungsten.

Storing data in the memory cell 100 comprises placing some portion of the total volume of the PCM layer 140 (the "switchable volume") into either a lower electrical resistance polycrystalline state or a higher electrical resistance amorphous state. Transitions between these states are accomplished by heating the PCM layer through the application of a pulse of switching current between the lower metal line 170 and the upper metal line 190 (which, in turn, are electrically coupled to the left and right silicon electrodes 124, 126, respectively). Advantageously, the placement of a portion of the PCM layer in the groove 122 acts to force the switching current to pass through a confined volume in the PCM layer near the bottom of the groove. When, for example, a switching current pulse is applied between the lower metal line and the upper metal line, the switching current pulse first passes through the left silicon electrode and into the PCM layer. At this point, the current must pass through the thin volume of PCM near the bottom of the groove in order to reach the right silicon electrode. Subsequently, after leaving the right silicon electrode, the current travels through the vertical contact 180 and into the upper metal line.

The confinement of the switching current to the volume of the PCM layer 140 near the bottom of the groove 122 results in a high localized current density in this volume, and, in turn, high ohmic heating. For this reason, this volume forms the switchable volume of the PCM layer in the memory cell 100. Outside of this switchable volume, the current density is insufficient to cause the transition between electrical resistance states. Accordingly, the magnitude of the required switching current pulse is substantially less than that which would be required to cause a state transition in the entire PCM layer. What is more, this memory cell design allows the magnitude of the switching current pulse to be readily tuned by adjusting the thickness and width of the PCM layer and/or the length of the PCM layer through which the switching current must pass. Through this kind of tuning, the magnitude of the switching current pulse may be readily adjusted to a value that is compatible with modern integrated circuits.

The duration of the switching current pulse is preferably between about 1 and about 500 nanoseconds and has a fast falling edge (i.e., less than about ten nanoseconds), although the invention is not limited to any particular duration and/or rise or fall time of the switching current pulse. The fast falling edge acts to freeze the switchable volume of the PCM layer 140 in its current electrical resistance state without allowing additional time for the bonds within the material to continue to rearrange.

Subsequently, reading the state of the memory cell 100 may be accomplished by applying a sensing voltage to the memory cell, again via the lower metal line 170 and the upper metal line 190. The ratio of the electrical resistances between the higher and lower electrical resistance states in a typical two-state PCM is between about 100:1 and 1,000:1. The sensing voltage is preferably of low enough magnitude to provide negligible ohmic heating in the PCM layer 140. Accordingly, the electrical resistance state of the PCM layer may be determined in this manner without disturbing its written electrical resistance state. Data integrity is thereby maintained while reading the data.

Figure 2A:
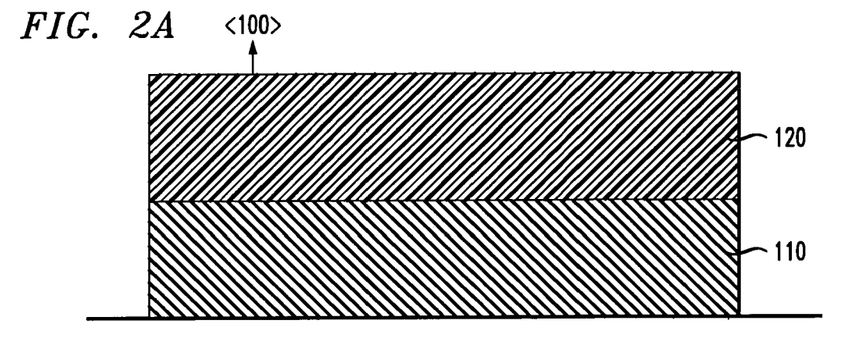
FIGS. 2A-2K show sectional and plan views of the FIG. 1A memory cell during various stages of its formation.
Figure 2B:
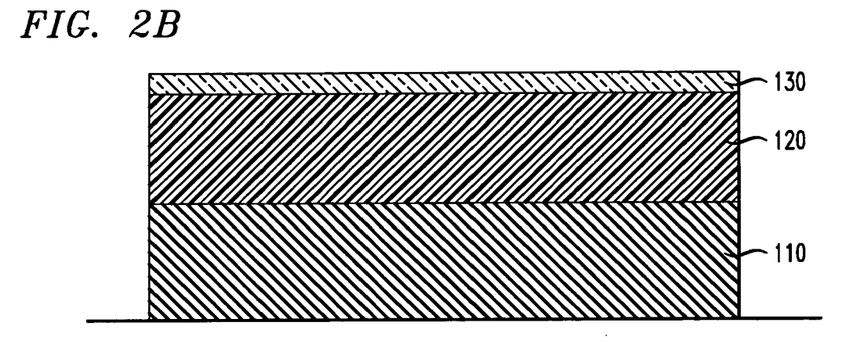

Advantageously, the memory cell 100 may be formed using a novel sequence of what are largely conventional semiconductor processing steps. FIGS. 2A-2K show an illustrative process sequence for forming the memory cell. Initially, a heavily n-doped silicon-on-insulator (SOI) substrate is acquired. The SOI substrate is shown in FIG. 2A. It is a layered structure comprising the silicon layer 120 disposed on the insulating layer 110. The silicon layer preferably has a top surface with a substantially <100> crystal plane orientation. This top surface is subsequently thermally oxidized using conventional semiconductor oxidation techniques to produce dielectric layer 130, resulting in the film stack shown in FIG. 2B.

Figure 2C:
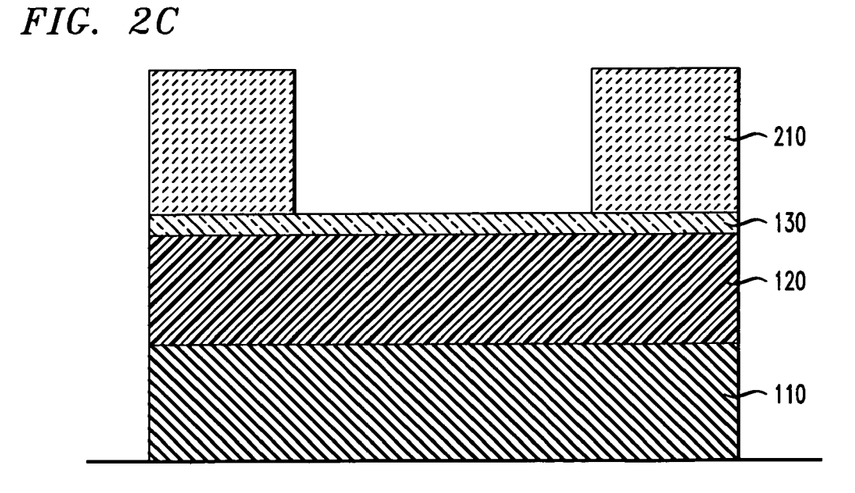

The film stack is then exposed to conventional photolithography to form a photoresist mask 210 with an opening over the region where the groove 122 is to be formed. The resultant film stack is shown in FIG. 2C. With the photoresist mask in place, the film stack is then exposed to a reactive ion etching (RIE) process to remove the unmasked portion of the dielectric layer 130 followed by an anisotropic etch process. Such an anisotropic etch process relies on the fact that certain etchants tend to etch different crystal planes of crystalline silicon at substantially different etch rates. For example, potassium hydroxide (KOH) etches the <100> crystal plane of silicon about 400 times faster than it etches the <111> crystal plane of silicon. As a result, the present anisotropic etch process may be accomplished by exposing the film stack to a solution comprising KOH, such as a solution of KOH, ethylene glycol and water. As an alternative to KOH, ethylene diamine pyrocatechol (EDP) may be used to selectively etch silicon. In addition there are several other selective etchants for crystalline silicon that will be known to one skilled in the art and will come within the scope of the invention.

Figure 2D:
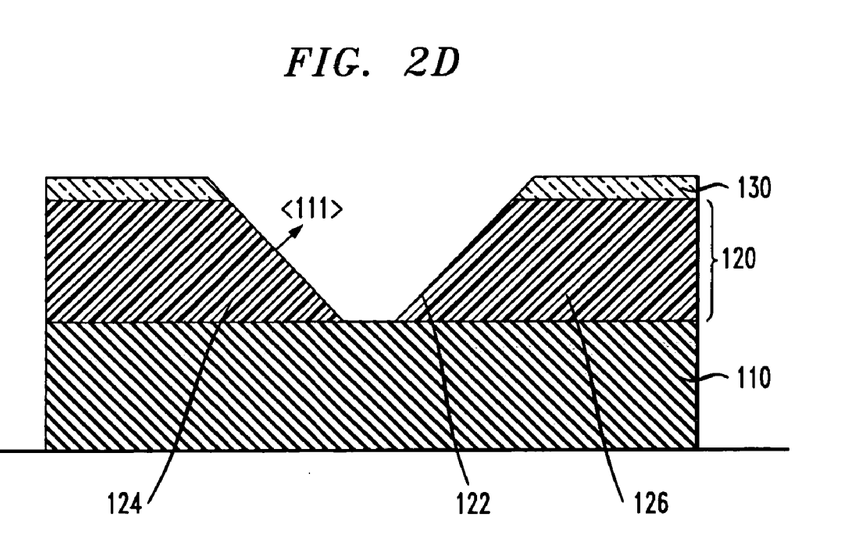

The anisotropic etch process forms the groove 122 in the silicon layer 120, as shown in FIG. 2D after the photoresist mask 210 is removed. The anisotropic etch process does not readily etch dielectric materials and, as a result, largely stops when it etches through the silicon layer and reaches the insulating layer 110. The resultant groove has characteristic oblique faces having substantially <111> crystal plane orientations. These oblique faces tend to be angled by about 55 degrees in relation to the remaining <100> surfaces of the silicon layer.

Figure 2E:
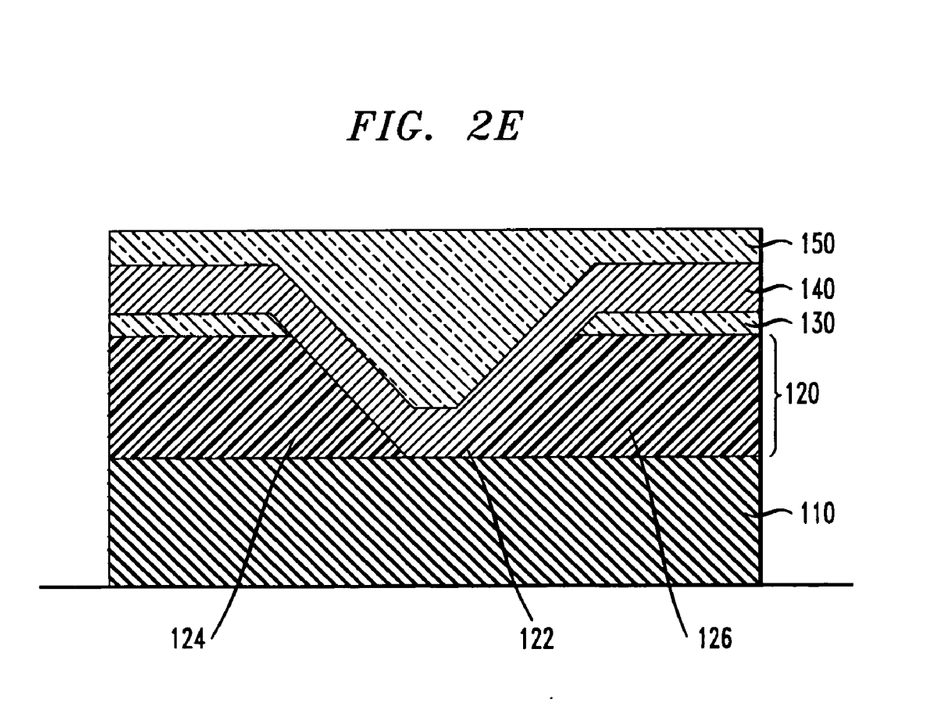

After the anisotropic etch process, a thin layer of PCM material (e.g., GST) is conformally deposited on the film stack by, for example, sputter deposition in order to from the PCM layer 140. Next, a layer of dielectric material (e.g., silicon dioxide or silicon nitride) is deposited on the PCM layer by, for example, CVD, and then chemical mechanical planarization (CMP) is used to planarize its top surface, thereby forming the dielectric hard mask layer 150. The resultant film stack is shown in FIG. 2E.

Figure 2F:
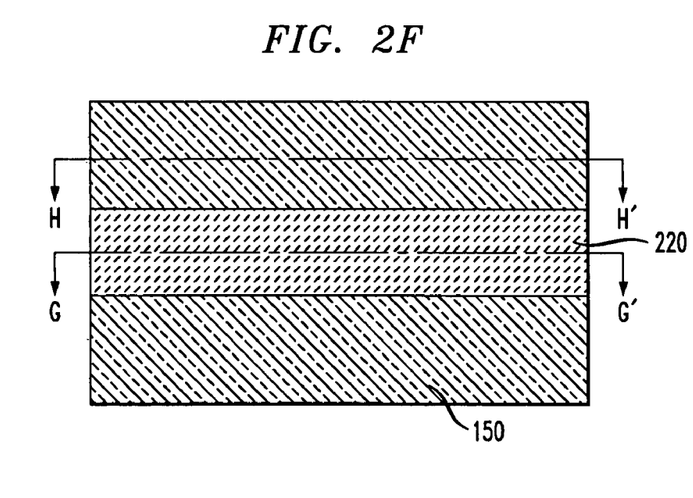
Figure 2G:
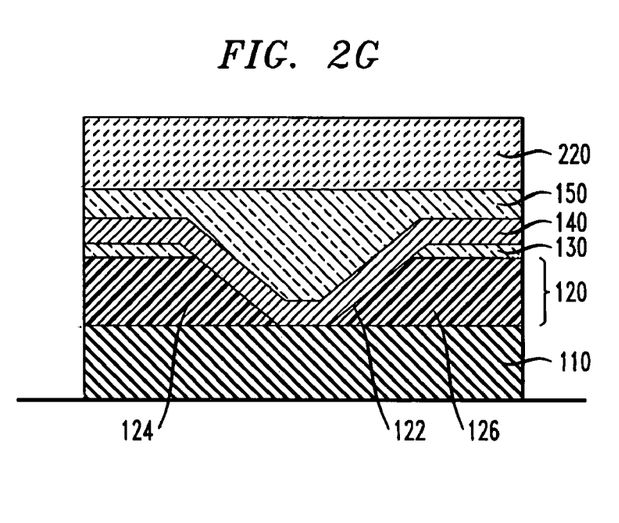
Figure 2H:
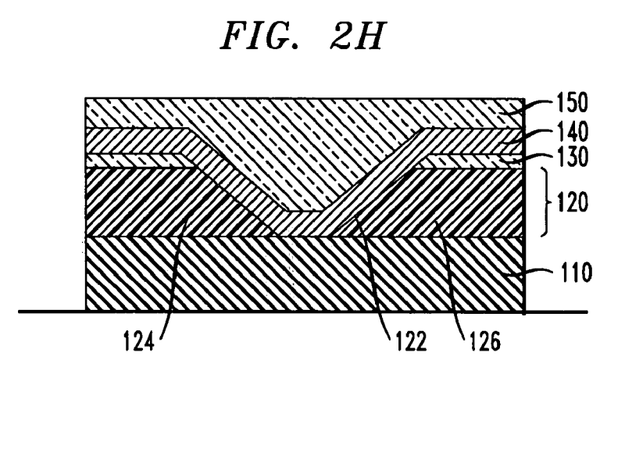
Figures 2I, 2J, 2K:
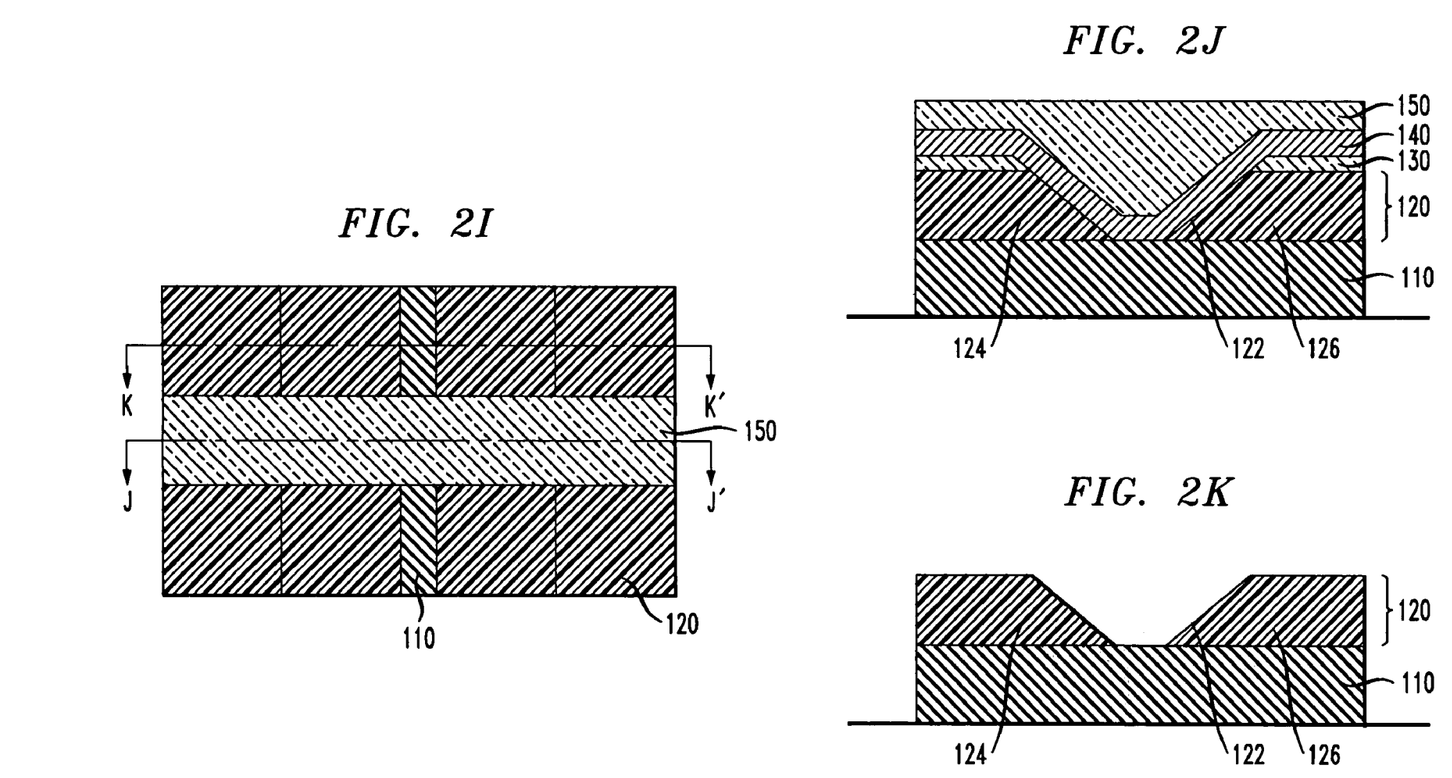

Another photolithography step is then performed on the film stack to form a second photoresist mask 220. FIG. 2F shows a plan view of the film stack with the second photoresist mask in place, while FIGS. 2G and 2H show sectional views along the planes defined by lines G-G' and H-H', respectively. Where the second photoresist mask is not present, the dielectric hard mask 150, the PCM layer 140 and the dielectric layer 130 are then removed by conventional RIE, resulting in the film stack shown in FIGS. 2I (plan view), 2J (sectional view along the plane defined by line J-J') and 2K (sectional view along the plane defined by line K-K'). As is shown in the figures, this processing causes the dielectric layer, the PCM layer and the dielectric hard mask layer to form a stripe that runs through the middle of the film stack.

Formation of the ILD layer 160, the lower metal line 170, the vertical contact 180 and the upper metal line 190 results in the memory cell 100 shown in FIGS. 1A-1C. Formation of a copper lower metal line may be accomplished with, for example, a damascene process that comprises depositing a portion of the ILD layer on the film stack, patterning this partial ILD layer with a trench that defines the shape of the lower metal line using photolithography and RIE, depositing copper into the trench using electroplating, and then removing any copper from the top of the partial ILD layer using CMP. The vertical contact and upper metal line may be subsequently formed by a second damascene process similar to that just described. It may comprise, for example, depositing the remainder of the ILD layer, patterning the layer with trenches in the shapes of the vertical contact and upper metal line, depositing copper into the trench, and then removing the copper from the top of the ILD layer with CMP. Alternatively, the vertical contact and upper metal line may be formed using separate damascene processes or various other suitable metallization sequences that will be familiar to one skilled in the art (e.g., metal deposition, photolithography and RIE).

Figure 3:
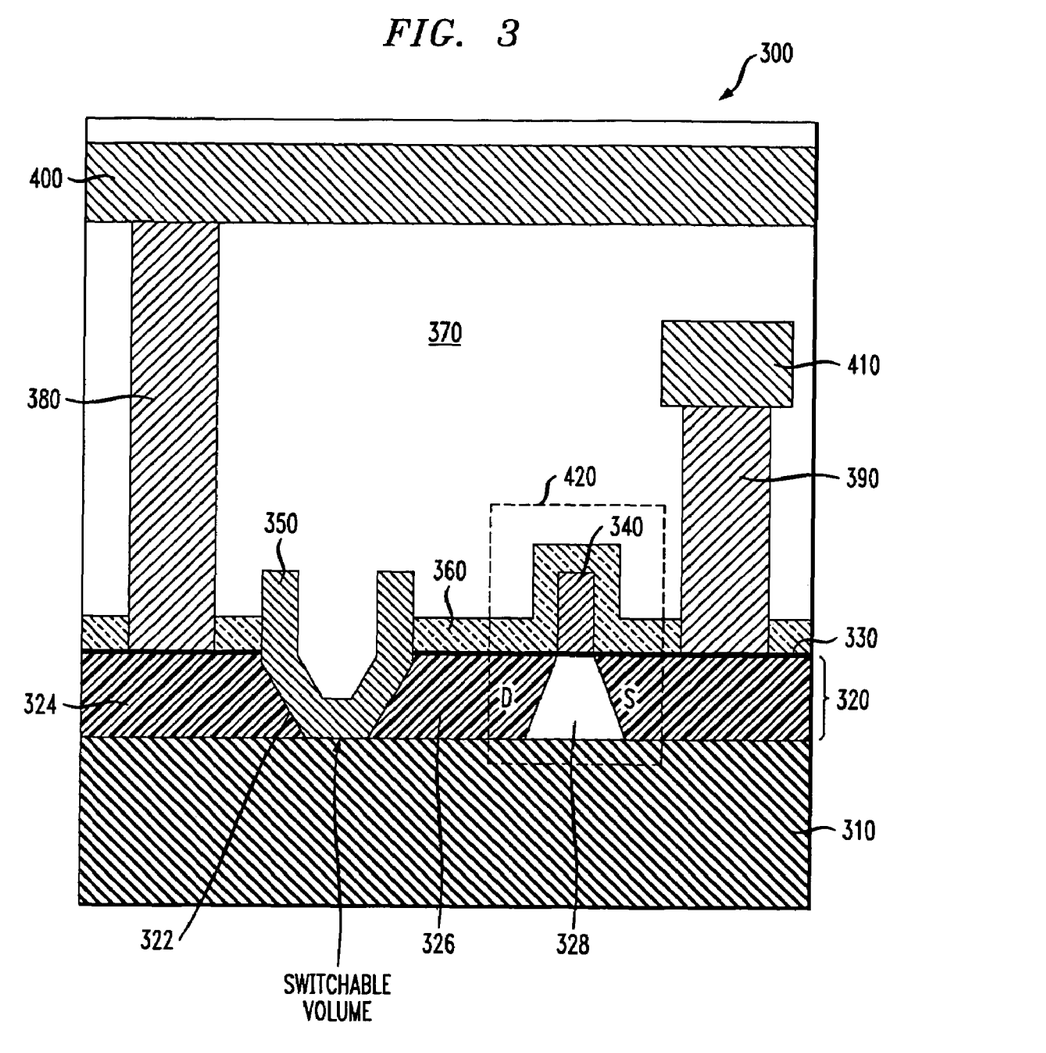
FIG. 3 shows a sectional view of a memory cell in accordance with a second illustrative embodiment of the invention.

FIG. 3 shows a sectional view of a memory cell 300 in accordance with a second illustrative embodiment of the invention. The memory cell comprises an insulating layer 310, a silicon layer 320, a gate dielectric layer 330 and a gate 340. The silicon layer defines a groove 322 that separates the silicon layer into a left silicon electrode 324 and right silicon electrode 326. The memory cell further comprises a PCM layer 350, a dielectric capping layer 360 and an interlevel dielectric (ILD) layer 370. Left and right vertical contacts 380 and 390, respectively, land on the silicon feature. The left vertical contact 380 is connected to an upper metal line 400, while the right vertical contact is connected to a lower metal line 410 that, in this particular embodiment, runs perpendicular to upper metal line.

In the illustrative memory cell 300, the insulating layer 310 and gate dielectric layer 330 preferably comprise silicon dioxide, while the PCM layer 350 preferably comprises GST. The silicon layer 320 is heavily n-doped except in a channel region 328 which is disposed below the gate and is lightly n-doped. The dielectric capping layer 360 preferably comprises silicon dioxide or silicon nitride. The ILD layer 370 preferably comprises silicon dioxide. The left and right vertical contacts, 380, 390 preferably comprise tungsten while the upper and lower metal lines 400, 410 preferably comprise copper or aluminum.

The doped silicon layer 320, the gate dielectric 330 and the gate 340 combine to form a metal-oxide-semiconductor field-effect transistor (MOSFET) 420. MOSFETs are extensively used modern integrated circuits and, as a result, their design and operation will be familiar to one skilled in that art. The portion of the silicon feature on the right side of the channel region 328 acts a source region for the MOSFET (labeled as "S" in FIG. 3) while the portion of the silicon feature on the left side of the channel region (acts as a drain region for the MOSFET (labeled as "D" in FIG. 3). In accordance with an aspect of the invention, the drain region of the MOSFET is electrically coupled to the right silicon electrode 326.

As before, storing data in the memory cell 300 comprises placing some portion of the total volume of the PCM layer 350 into either a lower electrical resistance polycrystalline state or a higher electrical resistance amorphous state by heating the PCM layer with a pulse of switching current. In the memory cell 300, this may be accomplished by sending a switching current pulse between the lower metal line 410 and upper metal line 400 while the gate 340 is set at a voltage sufficient to allow the current pulse to be transmitted through the channel region 328 of the MOSFET 420. Under such conditions, the current pulse will be transmitted from the lower metal line through the MOSFET and into the MOSFET's drain region and the right silicon electrode 326. At this point, the current must travel through the thin volume of the PCM layer 350 near the bottom of the groove 322 in order to reach the left silicon electrode 324 and, eventually, the upper metal line.

As in the memory cell 100, the confinement of the switching current to the volume of the PCM layer 350 near the bottom of the groove 322 causes that portion of PCM layer to behave as the switchable volume in the memory cell 300. Advantageously the memory cell 300, therefore, also allows the magnitude of the switching current pulse to be readily tuned in the manner described above (i.e., by adjusting PCM layer thickness, width and/or the length of current flow).

Figure 4A:
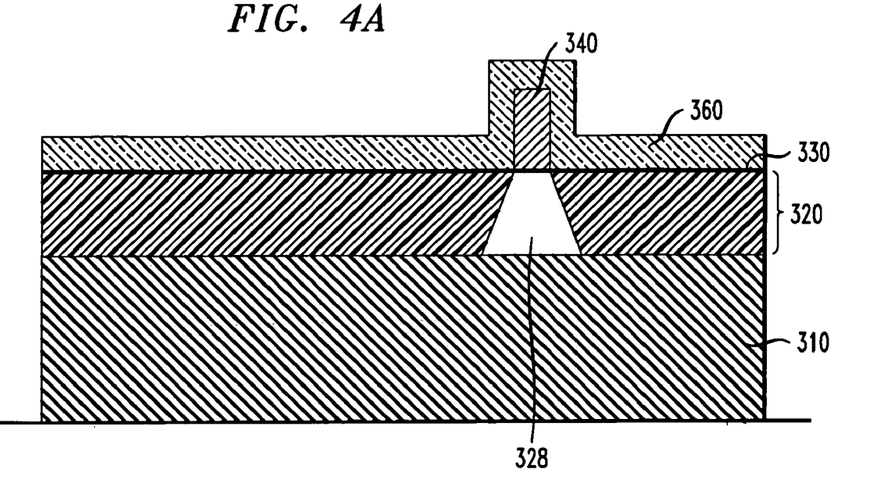
FIGS. 4A-4F show sectional views of the FIG. 3 memory cell during various stages of its formation.

Formation of the memory cell 300 may be achieved using a novel sequence of conventional semiconductor processing steps. FIGS. 4A-4F show sectional views of the memory cell during various stages of its formation. FIG. 4A, for example, shows the film stack as it appears after the initial processing steps. As before, processing is preferably started with a SOI substrate comprising the insulating layer 310 and the silicon layer 320. The silicon layer is preferably lightly n-doped. The silicon layer is subsequently exposed to a thermal oxidation step to form the gate dielectric layer 330. Next, the gate 340 is formed by depositing a layer of gate material (e.g., polysilicon or tungsten deposited by CVD or sputter deposition) and then patterning this layer using photolithography and RIE. With the gate in place, the silicon layer is then ion implanted with additional n-dopants (e.g., phosphorous) to make the silicon layer highly n-doped in those regions not covered by the gate. After that, a layer of dielectric material (e.g., silicon dioxide or silicon nitride) is deposited by, for example, CVD on the film stack to form the dielectric capping layer 360.

Figure 4B:
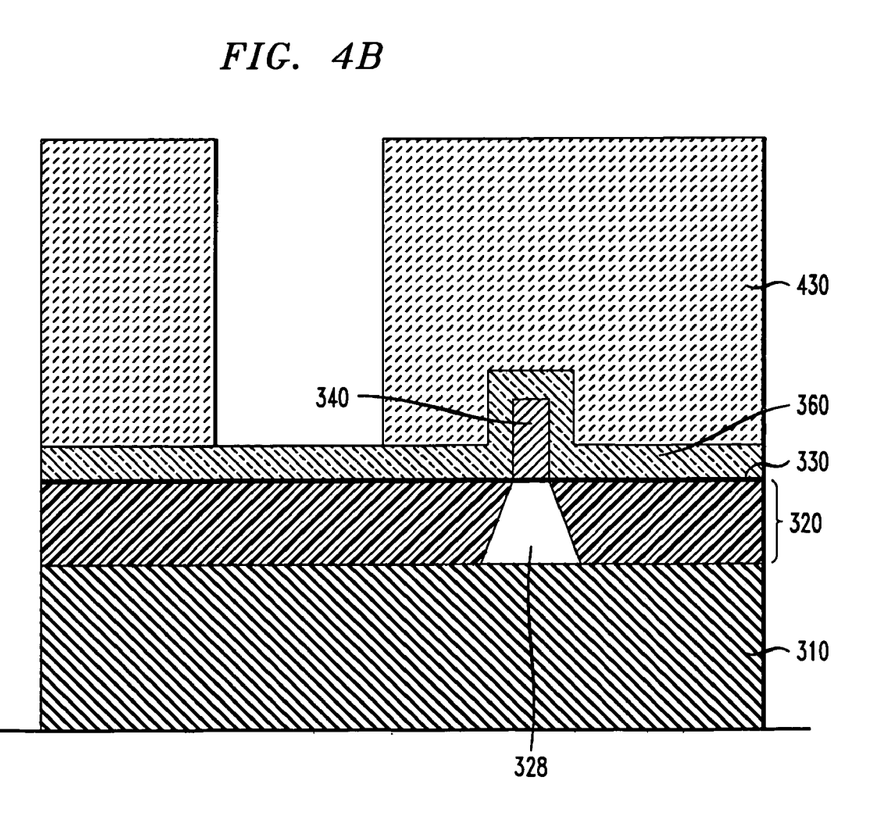
Figure 4C:
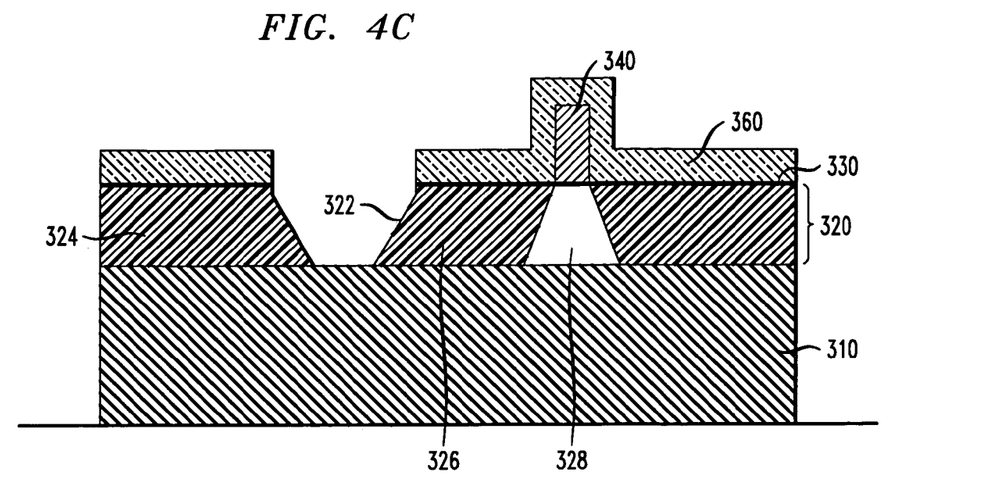

Following these steps, conventional photolithography is utilized to form a photoresist mask 430 with an opening over the region of the film stack where the groove 322 is to be formed, as shown in FIG. 4B. With the photoresist mask in place, the dielectric capping layer is then etched by RIE and the underlying portion of the silicon feature is exposed to an anisotropic etch process (e.g., a solution comprising potassium hydroxide). The groove is thereby formed, as shown in FIG. 4C.

Figure 4D:
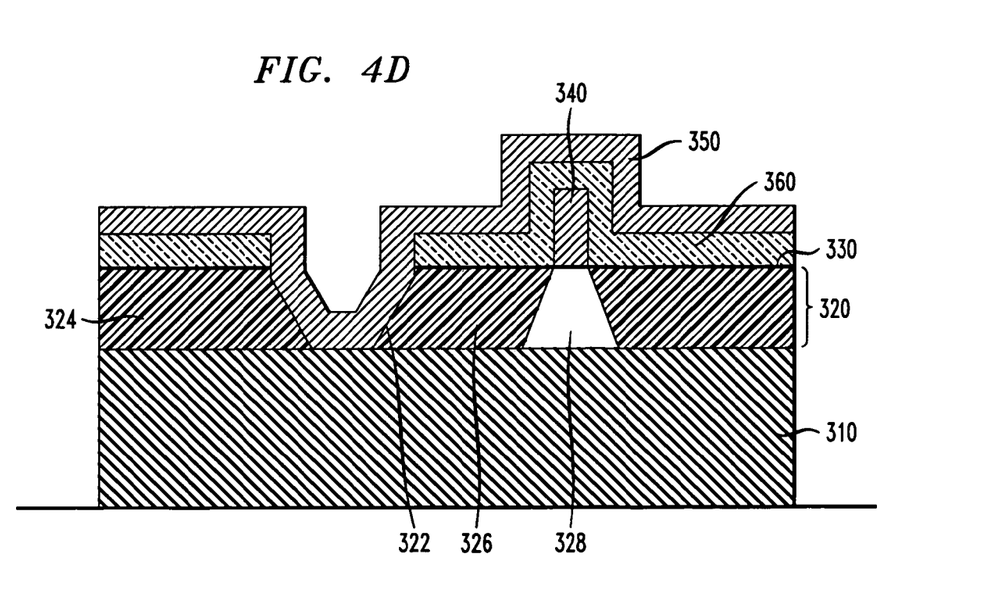
Figure 4E:
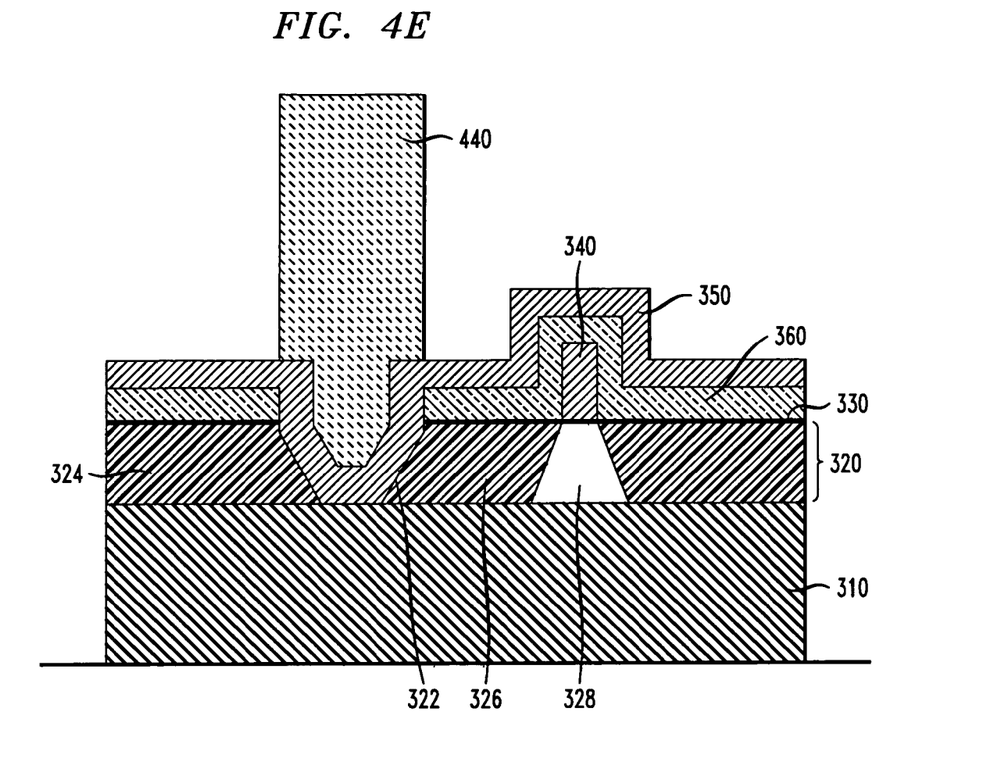
Figure 4F:
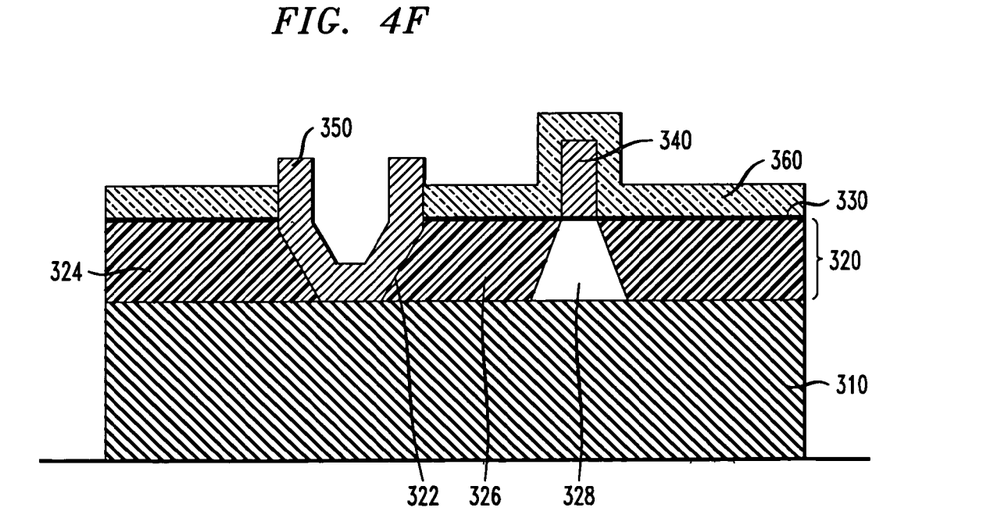

Next, a layer of PCM material (e.g., GST) is deposited on the film stack by, for example, sputter deposition to form the PCM layer 350, as shown in FIG. 4D. A second photolithography step is then utilized to form a second photoresist mask 440 over the portion of the PCM layer that is disposed within the groove 322, as shown in FIG. 4E. Any PCM material not covered by the second photoresist mask is then removed by RIE. After stripping the second photoresist mask, the film stack appears as shown in FIG. 4F.

The ILD layer 370, the left and right vertical contacts, 380, 390 and the upper and lower metal lines 400, 410 may then be formed using conventional damascene processing steps similar to those described above for the memory cell 100. Once these elements are completed, the resultant film stack will appear identical to memory cell 300 shown in FIG. 3.

It should be noted that, while the above-described embodiments of the invention each describe a memory cell capable of storing a single bit of data at any given time, it is possible to modify either one of these embodiments so that the respective memory cells are capable of simultaneously storing more than one bit of data. Such a modification is achieved, for example, by utilizing a PCM layer comprising two or more sublayers having different compositions and, as a result, different threshold temperatures for transitions between electrical resistance states. When writing to a memory cell with such a multi-component PCM layer, the magnitude of the switching current pulse may then be adjusted to cause one, all, or just a portion of the one or more sublayers within the PCM layer to change electrical resistance states, thereby providing the ability to simultaneously store multiple bits of information in a single memory cell. Such multi-bit memory cells will come within the scope of this invention.

It should also be noted that the memory cells described above are part of the design for an integrated circuit chip. The chip design is created in a graphical computer programming language, and is stored in a computer storage medium (such as a disk, tape, physical hard drive or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips may be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product may be any product that includes integrated circuit chips, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments, and that various other changes and modifications may be made to these embodiments by one skilled in the art without departing from the scope of the appended claims.

What is claimed is:

1. A memory cell comprising:
   a semiconductor feature, the semiconductor feature defining a groove that divides the semiconductor feature into a first electrode and a second electrode; and
   phase change material, the phase change material at least partially filling the groove and electrically coupling the first and second electrodes;
   wherein at least a portion of the phase change material is operative to switch between lower and higher electrical resistance states in response to an application of a switching signal to at least one of the first and second electrodes; and
   wherein the semiconductor feature comprises silicon and the groove comprises at least one silicon sidewall with a substantially <111> crystal plane orientation.

2. The memory cell of claim 1, wherein the groove is at least partially formed by anisotropically etching silicon.

3. The memory cell of claim 1, further comprising a first metal line and a second metal line, the first and second metal lines being electrically coupled to respective ones of the first and second electrodes.

4. The memory cell of claim 3, wherein the first metal line and second metal line run substantially perpendicular to one another proximate to the semiconductor feature.

5. The memory cell of claim 1, further comprising a field effect transistor with a source and a drain, at least one of the source and the drain being electrically coupled to at least one of the first and the second electrodes.

6. The memory cell of claim 1, wherein the portion of the phase change material operative to switch between lower and higher electrical resistance states is substantially located inside the groove.

7. The memory cell of claim 1, wherein the phase change material comprises germanium, antimony, sulfur, indium, selenium or tellurium, or a combination thereof.

8. The memory cell of claim 1, wherein the phase change material comprises a ternary alloy comprising germanium, antimony and tellurium.

9. The memory cell of claim 1, wherein the phase change material comprises a transition metal oxide.

10. The memory cell of claim 1, wherein the phase change material comprises two or more sublayers having different compositions.

11. The memory cell of claim 1, wherein the memory cell is operative to simultaneously store more than one bit of information.

12. The memory cell of claim 1, wherein the semiconductor feature is at least partially disposed on an insulating material.

13. A method of forming a memory cell, the method comprising the steps of:
    forming a semiconductor feature, the semiconductor feature defining a groove that divides the semiconductor feature into a first electrode and a second electrode; and
    forming phase change material, the phase change material at least partially filling the groove and electrically coupling the first and second electrodes;
    wherein at least a portion of the phase change material is operative to switch between lower and higher electrical resistance states in response to an application of a switching signal to at least one of the first and second electrodes; and
    wherein the semiconductor feature comprises silicon and the groove comprises at least one silicon sidewall with a substantially <111> crystal plane orientation.

14. The method of claim 13, wherein the memory cell is formed on a silicon-on-insulator substrate.

15. An integrated circuit comprising one or more memory cells, at least one of the one or more memory cells comprising:
    a semiconductor feature, the semiconductor feature defining a groove that divides the semiconductor feature into a first electrode and a second electrode; and
    phase change material, the phase change material at least partially filling the groove and electrically coupling the first and second electrodes;
    wherein at least a portion of the phase change material is operative to switch between lower and higher electrical resistance states in response to an application of a switching signal to at least one of the first and second electrodes; and
    wherein the semiconductor feature comprises silicon and the groove comprises at least one silicon sidewall with a substantially <111> crystal plane orientation.

16. The integrated circuit of claim 15, wherein the integrated circuit comprises a random access memory.

17. The integrated circuit of claim 15, wherein the integrated circuit comprises a nonvolatile memory.

18. The method of claim 13, wherein the step of forming the semiconductor feature comprises anisotropically etching silicon.

19. The method of claim 18, wherein anisotropically etching silicon comprises exposing silicon to a solution including potassium hydroxide or ethylene diamine pyrocatechol, or a combination thereof.

* * * * *